United States Patent
Almogy et al.

(10) Patent No.: US 9,153,413 B2
(45) Date of Patent: Oct. 6, 2015

(54) MULTI-BEAM SCANNING ELECTRON BEAM DEVICE AND METHODS OF USING THE SAME

(75) Inventors: Gilad Almogy, Kiriat Ono (IL); Avishai Bartov, Hod-Hasharon (IL); Juergen Frosien, Riemerling (DE); Pavel Adamec, Haar (DE); Helmut Banzhof, Poing (DE)

(73) Assignee: Applied Materials Israel, Ltd., Rehovot (IL)

( * ) Notice: Subject to any disclaimer, the term of this patent is extended or adjusted under 35 U.S.C. 154(b) by 403 days.

(21) Appl. No.: 12/528,307

(22) PCT Filed: Feb. 22, 2008

(86) PCT No.: PCT/EP2008/001413
§ 371 (c)(1),
(2), (4) Date: Feb. 10, 2010

(87) PCT Pub. No.: WO2008/101713
PCT Pub. Date: Aug. 28, 2008

(65) Prior Publication Data
US 2010/0320382 A1    Dec. 23, 2010

Related U.S. Application Data

(60) Provisional application No. 60/891,185, filed on Feb. 22, 2007, provisional application No. 61/014,702, filed on Dec. 18, 2007.

(51) Int. Cl.
*G21K 7/00* (2006.01)
*H01J 37/05* (2006.01)
(Continued)

(52) U.S. Cl.
CPC .............. *H01J 37/05* (2013.01); *H01J 37/10* (2013.01); *H01J 37/147* (2013.01); *H01J 37/28* (2013.01);
(Continued)

(58) Field of Classification Search
CPC ............. H01J 2237/1508; H01J 2237/2449; H01J 2237/2817; A01B 12/006
USPC ............. 250/306, 311, 492.1, 492.2, 492.3
See application file for complete search history.

(56) References Cited

U.S. PATENT DOCUMENTS 5,585,630 A * 12/1996 Taniguchi et al. ............ 250/311
6,509,569 B1 * 1/2003 Frosien ...................... 250/396 R
(Continued)

FOREIGN PATENT DOCUMENTS

EP        1100111 A1     5/2001
JP      2003-187730 A    7/2003
(Continued)

OTHER PUBLICATIONS

EPO Office Action dated Jul. 12, 2011 for European Patent Application No. 08715964.6.
(Continued)

*Primary Examiner* — Nicole Ippolito
*Assistant Examiner* — Jason McCormack
(74) *Attorney, Agent, or Firm* — Patterson & Sheridan, LLP

(57) ABSTRACT

A multi-beam scanning electron beam device (100) is described. The multi-bea scanning electron beam device having a column, includes a multi-beam emitter (110) for emitting a plurality of electron beams (12,13,14), at least one common electron beam optical element (130) having a common opening for at least two of the plurality of electron beams and being adapted for commonly influencing at least two of the plurality of electron beams, at least one individual electron beam optical element (140) for individually influencing the plurality of electron beams, a common objective lens assembly (150) for focusing the plurality of electrons beams having a common excitation for focusing at least two of the plurality of electron beams, and adapted for focusing the plurality of electron beams onto a specimen (20) for generation of a plurality of signal beams (121, 131,141), and a detection assembly (170) for individually detecting each signal beam on a corresponding detection element.

24 Claims, 11 Drawing Sheets

(51) Int. Cl.
*H01J 37/10* (2006.01)
*H01J 37/147* (2006.01)
*H01J 37/28* (2006.01)

(52) U.S. Cl.
CPC .. *H01J 2237/0635* (2013.01); *H01J 2237/1508* (2013.01); *H01J 2237/2449* (2013.01); *H01J 2237/2817* (2013.01)

(56) References Cited

U.S. PATENT DOCUMENTS

| | | | |
|---|---|---|---|
| 6,897,444 B1 * | 5/2005 | Adler | 850/9 |
| 6,917,043 B2 * | 7/2005 | Thomas et al. | 250/398 |
| 6,930,756 B2 * | 8/2005 | Akutsu et al. | 355/53 |
| 7,304,302 B1 * | 12/2007 | Nunan et al. | 250/311 |
| 2001/0028046 A1 | 10/2001 | Hamaguchi et al. | |
| 2002/0015143 A1 | 2/2002 | Yin et al. | |
| 2002/0096646 A1 * | 7/2002 | Shimazu et al. | 250/492.1 |
| 2002/0109090 A1 * | 8/2002 | Nakasuji et al. | 250/311 |
| 2002/0148975 A1 * | 10/2002 | Kimba et al. | 250/492.1 |
| 2002/0166964 A1 * | 11/2002 | Talbot et al. | 250/307 |
| 2003/0132382 A1 * | 7/2003 | Sogard | 250/311 |
| 2003/0189180 A1 * | 10/2003 | Hamaguchi et al. | 250/492.3 |
| 2004/0113073 A1 * | 6/2004 | Nakasuji et al. | 250/306 |
| 2004/0140432 A1 * | 7/2004 | Maldonado et al. | 250/423 P |
| 2004/0232349 A1 * | 11/2004 | Kruit | 250/396 R |
| 2005/0045821 A1 * | 3/2005 | Noji et al. | 250/311 |
| 2005/0194535 A1 * | 9/2005 | Noji et al. | 250/311 |
| 2005/0199807 A1 * | 9/2005 | Watanabe et al. | 250/306 |
| 2006/0060775 A1 * | 3/2006 | Sakakibara et al. | 250/307 |
| 2006/0060790 A1 | 3/2006 | Nakasuji et al. | |
| 2006/0118719 A1 * | 6/2006 | Watanabe et al. | 250/310 |
| 2006/0226361 A1 * | 10/2006 | Frosien et al. | 250/310 |
| 2007/0057200 A1 * | 3/2007 | Fujita et al. | 250/492.1 |
| 2007/0228274 A1 * | 10/2007 | Elyasaf et al. | 250/306 |
| 2009/0212213 A1 * | 8/2009 | Nakasuji et al. | 250/310 |
| 2011/0204263 A1 * | 8/2011 | Phaneuf et al. | 250/492.2 |

FOREIGN PATENT DOCUMENTS

| | | |
|---|---|---|
| JP | 2005-017270 A | 1/2005 |
| JP | 2005-091342 A | 4/2005 |
| JP | 2005-174568 A | 6/2005 |
| JP | 2005-266910 A | 9/2005 |
| JP | 2006-261111 A | 9/2006 |
| JP | 2006-278027 A | 10/2006 |
| JP | 2006-278029 A | 10/2006 |
| WO | WO-2006/093268 | 9/2006 |
| WO | WO 2006093268 A1 * | 9/2006 |

OTHER PUBLICATIONS

Japanese Office Action dated Apr. 7, 2014 for Application No. 2013-125732.
Japanese Office Action for Japanese Application No. 2014-236819 dated Jan. 5, 2015.
Japanese Office Action for Japanese Application No. 2013-125732 dated Feb. 4, 2015.

* cited by examiner

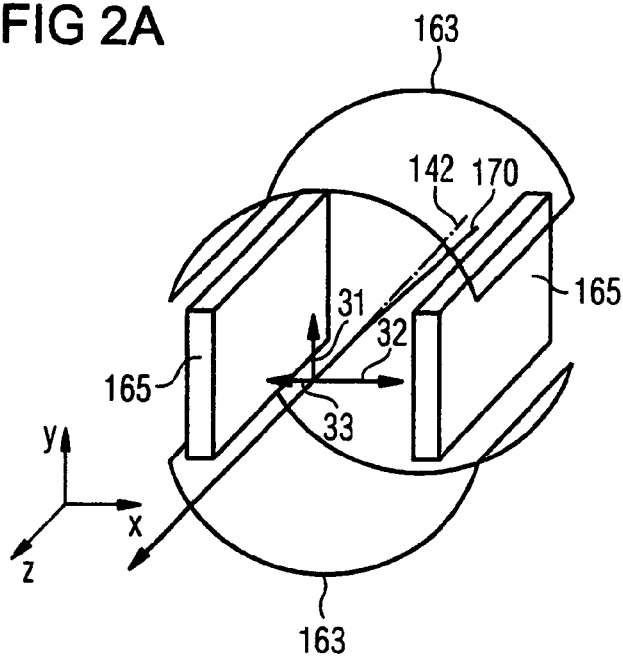
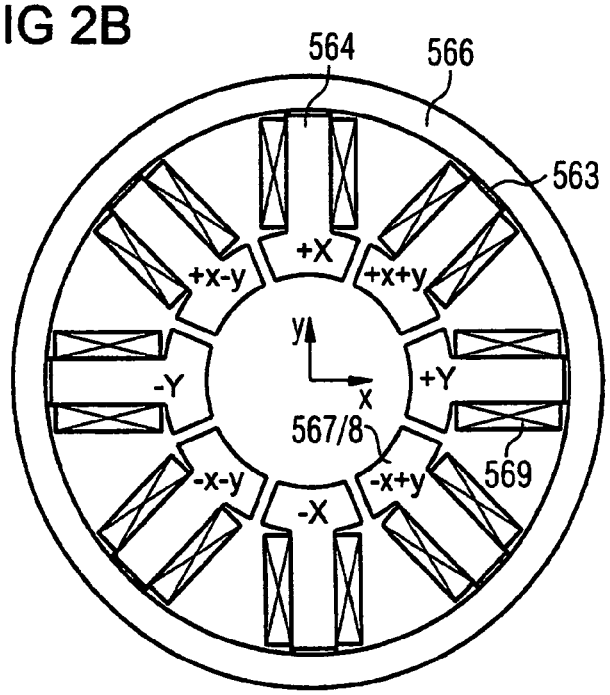

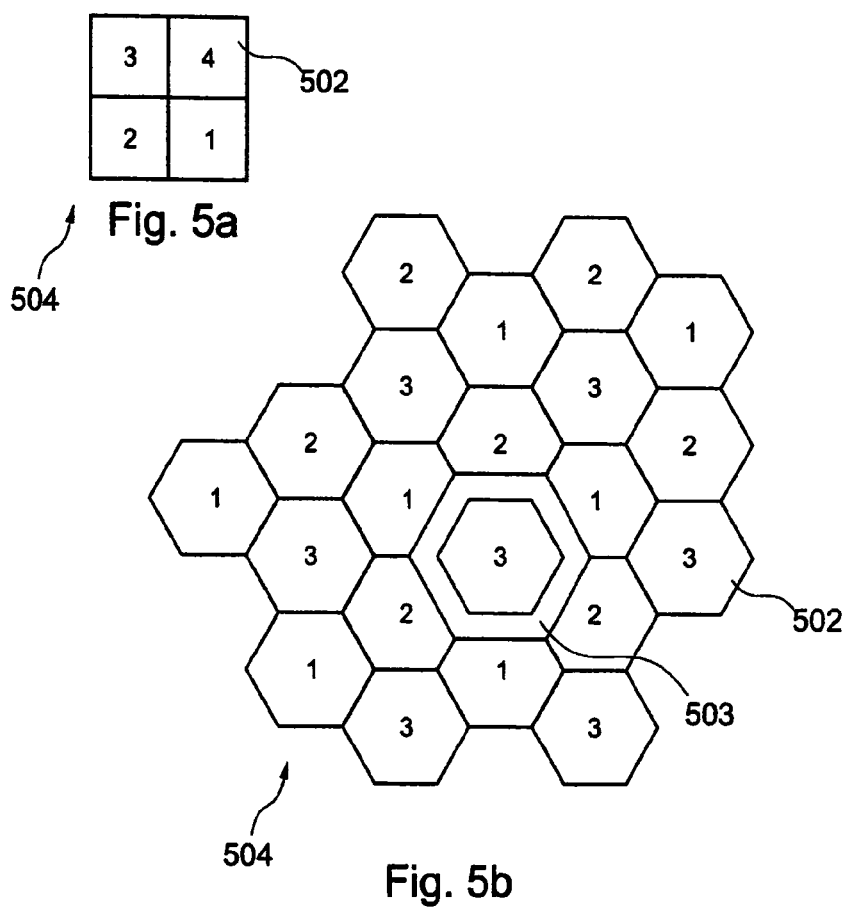
Fig. 5a
Fig. 5b
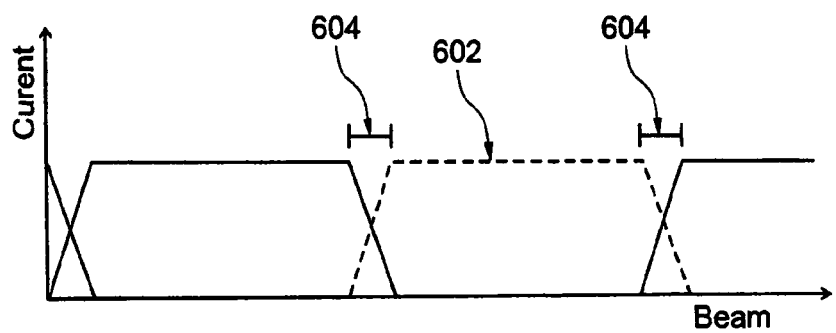
Fig. 6

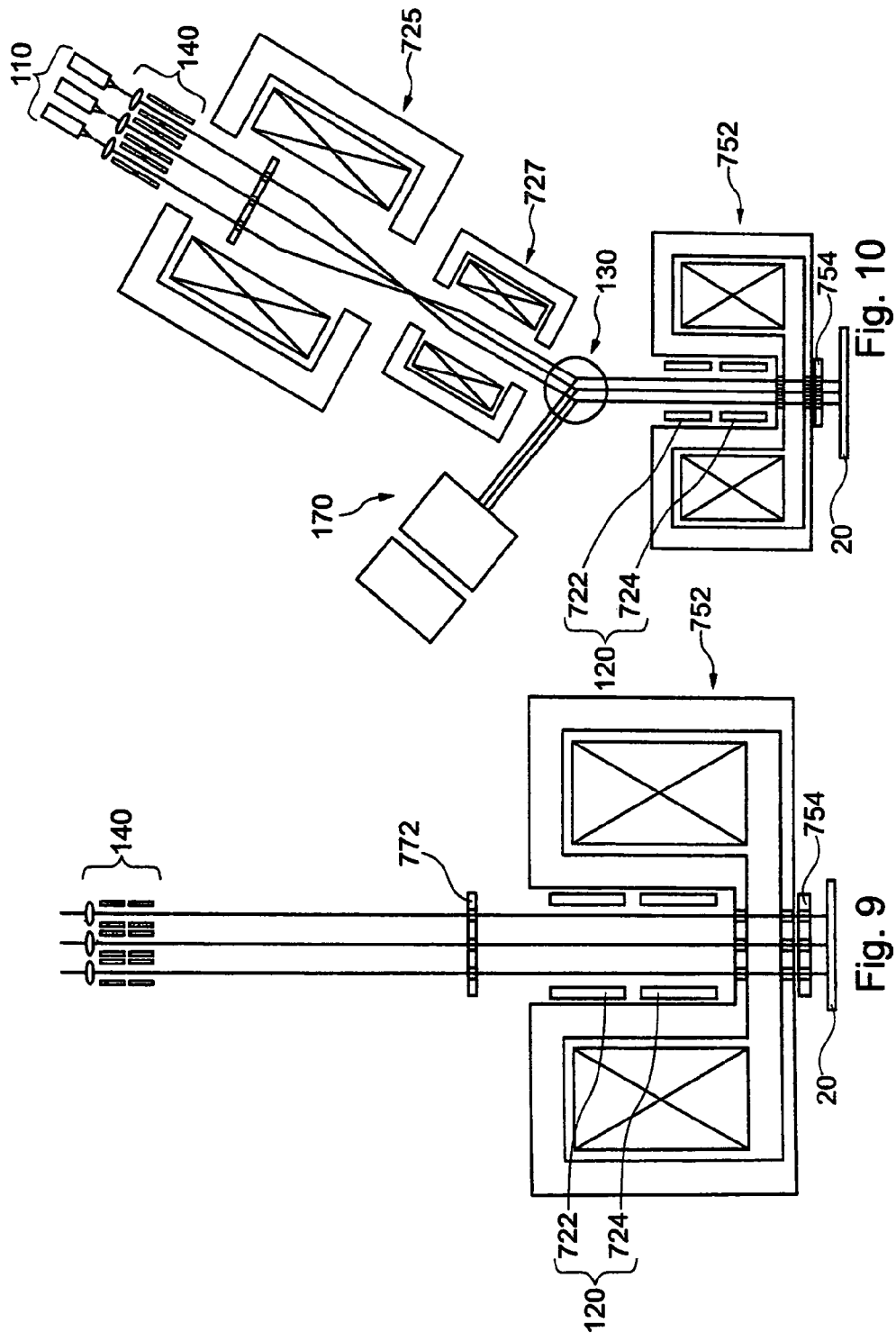

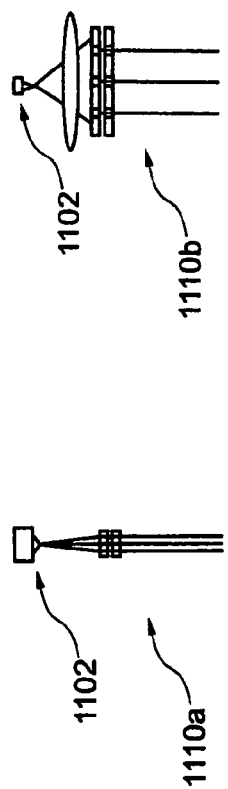

MULTI-BEAM SCANNING ELECTRON BEAM DEVICE AND METHODS OF USING THE SAME

FIELD OF THE INVENTION

The present invention relates to a multi-beam electron microscope, in particular a high throughput tool for the semiconductor industry. Specifically it relates to a multi-beam scanning electron beam device, a method of operating a multi-beam scanning electron beam device, and uses of a multi-beam scanning electron beam device.

BACKGROUND OF THE INVENTION

A modern semiconductor device is component of approximately 20-30 pattern layers that collectively implement the intended functionality of the designer. In general, the designer describes the chip functionality with high level, behavior design languages like VHDL, and then a series of EDA tools translate the high-level description into a GDSII file. The GDSII file contains a geometrical description of polygons and other shapes that describe the patterns of the different layers. The GDSII file accompanied with process design rules for the fabrication process to be used to make the device describes the intended geometry on the layout with the relevant tolerances.

Modern photolithography presents several challenges, including those associated with moving from 90 nm to 45 nm and 32 nm while keeping the stepper wavelengths at 193 nm. This requires further transformation of the intended layout geometry to a post resolution enhancement technique (RET) version of the GDSII file. The new GDSII file includes pattern modifications for optical proximity corrections (OPC) and mask technology. The complex set of OPC corrections, mask-making and stepper conditions is required to print the intended geometry on the wafer.

In light of the above, semiconductor technologies have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular electron beams, offer superior spatial resolution compared to photon beams, due to their short wavelengths at comparable particle energy.

For semiconductor manufacturing, throughput can be a significant limitation in tools for scanning a geometry in its entirety. Assuming a CD-SEM resolution of 1 nm, a 10 mm$^2$ die contains 10E14 pixels. Accordingly, for covering the entire layout, a parallel architecture is desired.

Electron beam systems for multiple electron beams, which may be used for a fast wafer inspection, are generally realized by either an array of conventional single beam columns having a spacing in the range of a few centimeters or by a single column with an array of beams. In the latter case, the beam array has relatively small electron beam spacing in a range of 10 μm-100 μm. Thereby, a high number such as hundreds or even thousands of beams can be used. However, individual corrections of the beams are difficult.

In order to provide a tool that utilizes electron beam optics to scan the entire geometry of the chip layer within resolution and desired signal to noise ratio (SNR), which enables extraction and verification of the wafer pattern geometry against the design-intended GDSII file, i.e. the original GDSII file, improved and different system designs have to be considered.

SUMMARY

In light of the above, a multi-beam scanning electron microscope according to independent claim 1, a method of operating a multi-beam scanning electron beam device according to independent claims 12 and 13 are provided.

According to one embodiment, a multi-beam scanning electron beam device is provided. The multi-beam scanning electron beam device having a column, includes a multi-beam emitter for emitting a plurality of electron beams, at least one common electron beam optical element having a common opening for at least two of the plurality of electron beams and being adapted for commonly influencing at least two of the plurality of electron beams, at least one individual electron beam optical element for individually influencing the plurality of electron beams, a common objective lens assembly for focusing the plurality of electron beams having a common excitation for focusing at least two of the plurality of electron beams, and being adapted for focusing the plurality of electron beams onto a specimen for generation of a plurality of signal beams, and a detection assembly for individually detecting each signal beam on a corresponding detection element.

Further advantages, features, aspects and details that can be combined with embodiments described herein are evident from the depending claims, the description and the drawings.

According to another embodiment, a method of operating a multi-beam scanning electron beam device for generation of an image of a wafer including two or more dies is provided. The method includes scanning a first region of a first die of the two or more dies for generating an image of the first region, scanning a second region of a second die of the two or more dies for generating an image of the second region, and combining the image of the first region and the image of the second region to an image of a virtual die.

According to yet another embodiment, a method of operating a multi-beam scanning electron beam device having at least a first and a second electron beam for generation of an image of a wafer including at least one die is provided. The method includes scanning a non-overlap first region of the die with a first electron beam current of the first electron beam for generating an image of the first region, scanning a non-overlap second region of the die with a second electron beam current of the second electron beam for generating an image of the first region, and scanning an overlap region between a scanning area of the first and the second electron beam with the first beam having a first overlap depending beam current function having electron beam currents being smaller than the first electron beam current and with the second beam having an second overlap depending beam current function having electron beam currents being smaller than the second electron beam current.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 2A shows a schematic view of an achromatic beam separator for multi-beam scanning electron beam devices according to embodiments described herein;

FIG. 2B shows another schematic view of an achromatic beam separator for multi-beam scanning electron beam devices according to embodiments described herein;

FIGS. 5A and 5B illustrate scanning schemes that can be used for multi-beam scanning electron beam devices according to embodiments described herein;

FIG. 6 illustrates a further scanning scheme that can be used for multi-beam scanning electron beam devices according to embodiments described herein;

FIG. 9 shows a schematic view of yet a further multi-beam scanning electron beam device according to embodiments described herein;

FIG. 10 shows a schematic view of an even further multi-beam scanning electron beam device according to embodiments described herein;

FIGS. 11A to 11C show schematic views of multi-beam emitters usable for multi-beam scanning electron beam devices according to embodiments described herein.

DETAILED DESCRIPTION OF THE INVENTION

Figure 1:
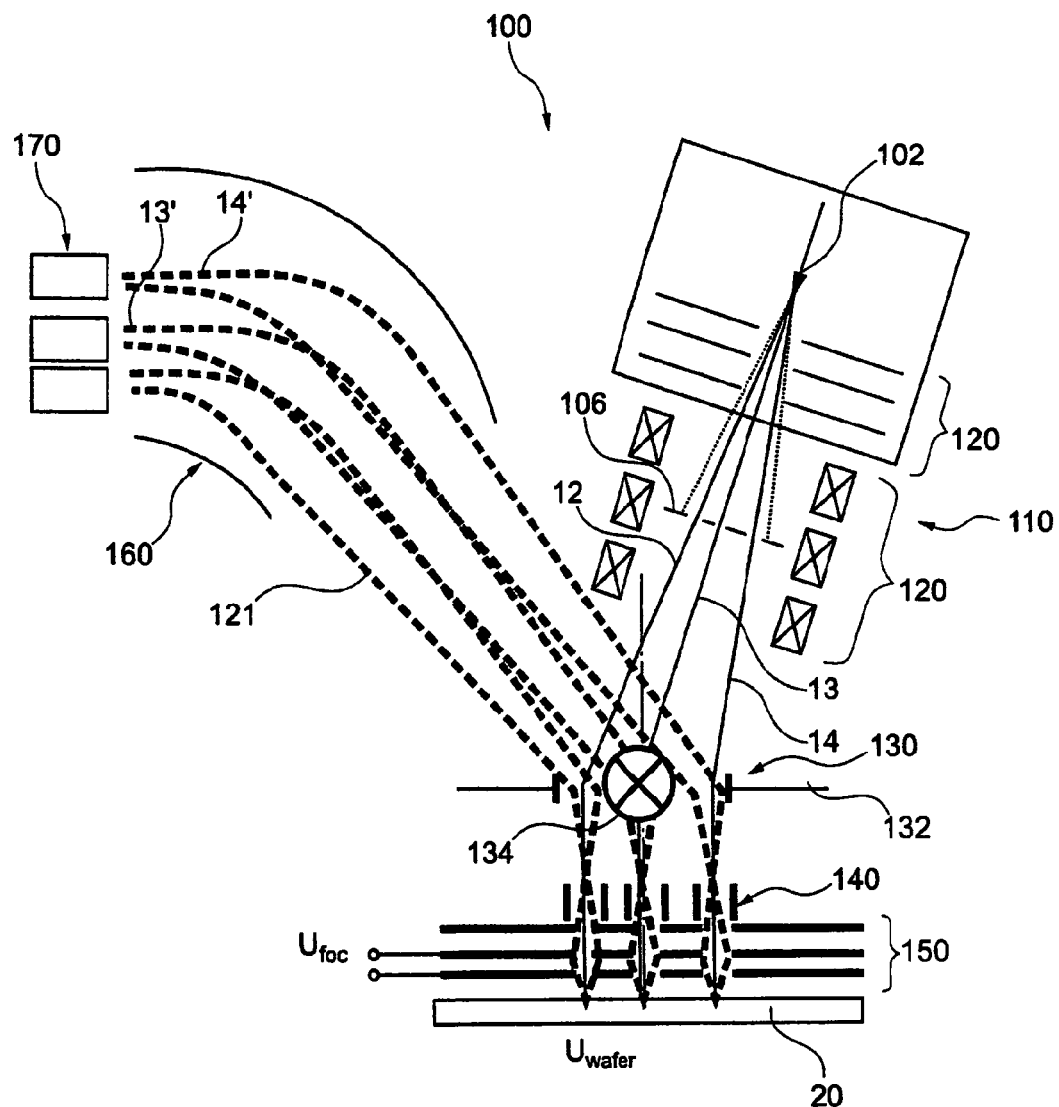
FIG. 1 shows a schematic view of a multi-beam scanning electron beam device according to embodiments described herein.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited, which is inspected or which is structured. A specimen includes a surface to be structured or on which layers are deposited, an edge, and typically a bevel.

For ease of reference, the term "common" as used herein is generally understood as referring to elements acting commonly on two or more beams, e.g., all beams, in the multi-beam system. The term "individual" as used herein is generally understood as referring to elements acting on individual beams only such that the individual beams can be independently controlled, modified, influenced or the like.

According to embodiments described herein, a multi-beam system with beam spacing that allows to separate between secondary beams (signal beams) without further restrictions, that allows for individual as well as common beam corrections, deflections, adjustment and/or focusing, and/or that allows the size of beam array not to be bigger than a few dies, e.g., one, two or three dies, in order to allow simultaneous inspection of the same die or neighboring dies is provided. Thereby, according to typical embodiments, in particular a high throughput multi-beam CD-SEM tool can be provided.

The multi-beam scanning electron microscope includes a multi-beam emitter 110. As sown in FIG. 1, the emitter tip 102 of the multi-beam emitter 110 emits an electron beam as indicated by the dashed lines. The aperture plate 106 of the multi-electron-emitter 106 generates electron beams 12, 13 and 14 respectively. Embodiments described herein are not limited to a line of three electron beams. According to further embodiments, lines of 2 to 10 or even 20 electron beams or more as well as arrays having from 2 to 10 or even 20 electron beams or more in one dimension of the array can be realized.

The multi-beam scanning electron beam device 100 includes common electron beam optics 120. A common electron beam optical element acts simultaneously on more than one, e.g., all of the electron beams (e.g. electron beams 12, 13 and 14 in FIG. 1.) The common electron beam optics can be selected from the group consisting of: condenser lenses (see, e.g. 120 in FIG. 1), alignment deflectors, field stigmators, and scanning deflectors. As a further example, it might be a rotation lens for rotating the line or array of electron beams. Thereby, as a typical implementation, two or more electron beams can pass through the same opening of the common electron beam optical element, e.g. the same opening for trespassing of the beam in the condenser lens 120 shown in the multi-beam emitter 110.

Further, the multi-beam scanning electron beam device 100 includes individual beam optics 140, which can be selected from the group consisting of: scanning deflectors, stigmators, individual focus adjustment units or individual focusing units for adjusting the individual focus of the electron beams.

According to additional or alternative implementations, the individual electron beam optics may be a pre-lens octupole system for individual beam alignment, beam scanning, lens alignment, stigmation correction and adjustment of individual focusing.

According to embodiments described herein, the multi-beam scanning electron beam device 100 further includes a common lens assembly 150 being an objective lens and focusing the line or array of electron beams simultaneously. The common objective lens assembly 150 can be electrostatic, magnetic or combined electrostatic-magnetic.

According to further additional or alternative implementations of the objective lens assembly, the array lens can be an electrostatic lens array, typically in an acceleration mode, a magnetic lens array or a combined electrostatic-magnetic lens array. If according to yet further embodiments, which can be combined with other embodiments described herein, at least a scanning element is close to the front focal plane of the objective lens assembly, telecentricity can be improved.

Yet further, the multi-beam scanning electron beam device includes a detection assembly 170 with a detection element corresponding to each individual beam. Accordingly, as shown in FIG. 1, there is one detection element for detecting secondary and/or backscattered particles for each of the electron beams 12, 13, and 14, respectively.

FIG. 1 shows an example of a multi-beam high throughput tool. Features of the multi-beam scanning electron beam device 100 can include a high current, high-resolution SEM, no electron-electron interaction in light of separated beams, individual scan, fine focus and stigmation correction for the individual beams, a high telecentricity in light of the position of the scanner in front of the focal plane, for example, an electronics and the detector at ground potential, separate detection elements for each beam, e.g. scintillator fiber detection with subsequence multipliers, and a scalability starting from a 4×4 array to a 10×10 array and beyond.

In the past, systems having the beam spacing that allows to separate between secondary beams without significant restrictions and at the same time having a beam spacing such that the array is not bigger than 1, 2 or 3 dies for a simultaneous inspection of the same die or neighboring dies have not been highlighted. According to embodiments described herein, multi-beam scanning electron beam devices can be provided and have a typical distance between two adjacent beams of a line of beams or an array of beams in the range of 0.5 to 5 mm, typically 1.5 to 3.5 mm, for example, 2 to 3 mm. Accordingly, embodiments described herein may include common electron beam optics, individual electron beam optics, common objective lens systems and individual detection, wherein for example also a separation between the beams to be detected can be conducted in an improved manner.

According to some embodiments described herein, as for example shown in FIG. 1, the multi-beam scanning electron beam device 100 may have a multi-beam emitter 110 including a single emitter tip 102, one or more elements for extracting, accelerating and/or shaping the electron beams and a grid aperture 106 for generating individual electron beams. Thereby, the emitter tip 102 of the multi-beam emitter emits one beam which is separated into the multiple beams by the aperture 106 of the multi-beam emitter 110. According to other embodiments, an emitter array with individual emitters for each electron beam can be used. According to yet other embodiments, a spot grid array, wherein the emission of one emitter tip is shaped and formed to exit in parallel and as corrected beams can also be used. Thereby, the grid aperture array or two or more grid aperture arrays can be used at one ore more potentials in order to shape and/or focus the beam. Accordingly, the emission of one emitter can appear in the column as multiple sources. Thus, subsequent optical elements or in combination with subsequent optical elements the multiple beams at the specimen appear to be generated by multiple sources. In light of the above, on the one hand, two or more emitters can be used for generation of the multiple beams. On the other hand, one emitter can be used. Thereby, one source or two or more sources can be provided by the one emitter.

According to yet further embodiments, the multi-beam emitter, i.e. the gun condenser area, can be provided as follows. According to one embodiment, a single emitter electron gun, typically the TFE source can be used. The aperture array for multi-beam generation can be included in an upper part of the column for generating the individual electron beams as early as possible. Thereby, the total beam current can be reduced as early as possible for avoiding electron-electron interaction. Thus, the overall current is reduced as early as possible in the column by generating the beamlets out of the common beam. According to yet further embodiments, the condenser for adjusting the virtual source z-location (z denoting the optical axis) and/or for matching the aperture array with the objective lens array can be included. According to yet further alternative or additional modifications, an X-Y stage for the aperture array can be provided in order to align the apertures for individual beam generation to the objective lens array. Typically, it is for example possible to have an electromagnetic alignment. According to even further additional or alternative modifications the mechanical aperture stage can be rotated or an axial magnetic field for rotation adjustment of the apertures to the objective lens array can be provided.

According to yet other embodiments, which can be combined with any of the embodiments described herein, a common achromatic deflector 130 or common achromatic beam separator 130 having an electrostatic deflection element 132 and the magnetic deflection element 134 can be provided. Within FIG. 1, only the magnetic field is indicated for illustrating the magnetic deflection element. The achromatic deflector 130 will be described in more detail with respect to the FIGS. 2A and 2B below. The achromatic deflector 130 deflects the primary electron beams 12, 13 and 14, respectively (in FIG. 1) and separates the primary electron beams 12, 13 and 14 from the secondary electron beams, i.e., the signal beams 12', 13', and 14'. A double focusing bender 160 provides further beam separation. Details of further embodiments relating to the double focusing bender will be described with respect to FIG. 4 below.

FIG. 2A shows an enlarged view of the achromatic separator. State of the art electron beam devices mostly use magnetic deflectors or Wien filters for beam separation of primary and secondary beams. Thereby, substantially perpendicular static electric and magnetic fields normal to the z-axis (optical axis) are used. The force acting on the electrons is given by the coulomb force $$F_e = q \cdot E \tag{1}$$

and the Lorentz force $$F_n = q \cdot (v \times B) \tag{2}$$

The angle of deflection of the electrons in the electric and magnetic fields, both of length l, can be described with the following equation:

$$\theta = ql(vB - E)/(mv^2) \tag{3}$$

FIG. 2A illustrates one embodiment of an achromatic bender or achromatic beam splitter 130. Therein, coil windings 163 and plate-shaped electrodes 165 are shown. The coils 163 generate a magnetic field 31. The magnetic field generates a magnetic force 32 for an electron beam 170. The magnetic force is generated according to equation 2. Substantially perpendicular to the magnetic field 31 an electric field is generated between the electrodes 165. Thereby, an electric force 33, which is substantially opposite to the magnetic force, is generated.

The embodiment shown in FIG. 2A generates perpendicular, uniform magnetic and electric fields. Within FIG. 2A, the electron beam path 170 is slightly inclined with respect to the axis 142 when the electrons enter the achromatic deflector. The electrons are deflected within the achromatic deflector to travel essentially along axis 144 after trespassing the achromatic deflector. This can be understood in light of the derivative of equation 3, that is $$d\Theta/dv = -(qlB/mv^2)(1-2E/vB) \tag{4}$$

The deflection angle is independent of the velocity of the electrons if the condition that the magnetic force equals twice the electric force is fulfilled. In FIG. 2A this is illustrated by the lengths of the force indicating arrows 32 and 33.

In embodiments described herein, the achromatic deflector 162 can be described at least by one of the following features. According to one embodiment, 20 to 80 ampere turns (Aturns), e.g., 40 Aturnes may be provided. According to an even further embodiment, about 10 to 400 coil windings can be provided. Yet according to another embodiment, 50 to 500 coil windings can be provided. Nevertheless, it might be possible to provide even more coil windings, for example, up to a few thousand.

According to an even further embodiment, the achromatic deflection angle can be between 0.3° and 7°. According to another further embodiment, the deflection angle is between 1° and 3°.

The achromatic beam deflector or beam splitter shown in FIG. 2A can be used in accordance with the present invention. Thereby, as described above, electrostatic deflection is given by:

$$\alpha_e \propto \frac{E_1}{U_A}, U_A \to U_A + \Delta U_A \Rightarrow \delta\alpha \propto -\Delta U_A$$

Further, magnetic deflection is given by:

$$\alpha_m \propto \frac{B_1}{\sqrt{U_A}}, U_A \to U_A + \Delta U_A \Rightarrow \delta\alpha \propto -\frac{1}{2}\Delta U_A$$

As described above, if the magnetic deflection equals minus two times the electrostatic deflection a deflection without chromatic aberration (dispersion) can be realized.

According to some embodiments described herein, which are illustrated with respect to FIG. 2B, systems including substantially pure dipole fields can be used. FIG. 2B shows a system having eight electrodes and pole pieces. Cores 564 are connected to the housing 566 via insulators 563. The coils for exciting the cores and, thereby, the pole pieces are wound around the cores 564. At the other end of the cores, electrode-pole pieces 567/8 are provided. According to embodiments employing a deflection unit as, for example, shown in FIG. 2A, the fringing fields can be provided to be similar for the magnetic field and the electric field; and highly pure dipole fields can be generated. However, the system including eight coils and eight electrodes require more current- and voltage-sources, thereby, costs are increased. As a result, optimized systems having two poles each (electric and magnetic), might typically be used for the embodiments described herein.

Generally, embodiments described herein relate to a high throughput, high-resolution imaging system. The imaging system (multi-beam scanning electron beam device) may include a multi-beam system with a high-performance objective lens array with low spherical and chromatic aberration, a low operation beams separator for separating primary and secondary electron beams, and a multi-channel signal detection.

Figure 2C:
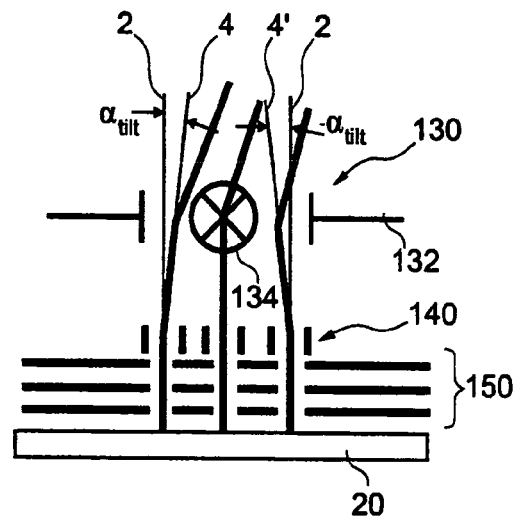
FIG. 2C shows a schematic enlarged view of an achromatic beam separator and an off-axis correction thereof according to embodiments described herein.

As shown in FIG. 2C, if according to some embodiments the electron beams do not enter the common achromatic beam separator parallel to each other the above described achromatic condition might not be fulfilled for all electron beams. FIG. 2C shows three electron beams entering the achromatic beam separator 130 having an electrostatic deflection element 132 and magnetic deflection elements 134. Thereby, the center beam is shown to meet the above described achromatic condition. However, the other two electron beams have a tilt angle which is different from the center electron beam and which is indicated with regard to the optical axis 2 of the objective lens assembly 150 and the tilted axis 4 and 4', respectively. Accordingly, for non-parallel electron beams the achromatic beam separator is not perfectly achromatic for all of the electron beams and can thus be denoted as a low aberration beams separator.

According to some embodiments, as shown in FIG. 2C, the individual electron beam optics 140 can be provided in the form of a quadrupole element or the like. Thereby, the beam tilt indicated by axis 4 and 4' of the left electron beam and the right electron beam, respectively, which is not parallel to the center electron beam, which has been deflected achromatically, can be introduced in the individual electron beam optics 140. The beam tilt $-\alpha_{tilt}$ and $\alpha_{tilt}$, which is introduced for vertical landing and alignment to the objective lens can thereby be introduced. Accordingly the individual electron beams pass through the common objective lens assembly 150 in parallel after compensating the off-axis electron beams.

Figure 2D:
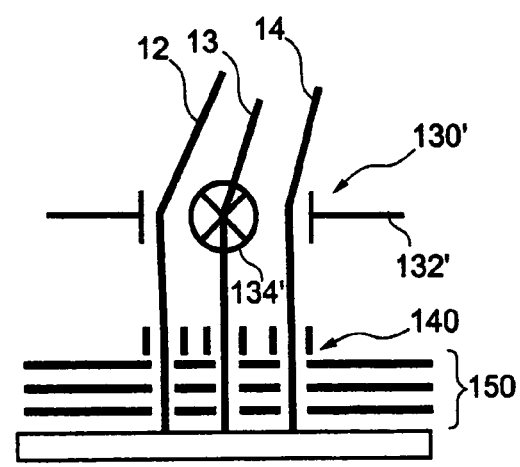
FIG. 2D shows a schematic enlarged view of an achromatic beam separator and a further off-axis correction thereof according to embodiments described herein.

According to further embodiments, as shown in FIG. 2D, the achromatic beam separator 130' having an electrostatic deflection element 132' and the magnetic deflection element 134' can be compensated by a superimposed quadrupole field, provided by quadrupole elements, which adjusts the achromatic beam deflection for electron beams that do not pass through the achromatic beam separator 130' on the center axis. As shown with respect to FIG. 2B, the achromatic beam deflector can be realized by an octupole element. This octupole element allows for an adjusted beam deflection for electron beams that travel through the achromatic beam separator off-axis. Thereby, the electron beams exit the achromatic beam separator parallel, as shown in FIG. 2D and dispersion of beam tilt deflectors such as element 140 can be avoided.

According to some embodiments, the multi-beam scanning electron microscope can have a common beam bender (see, e.g., 160 in FIG. 1) adapted for having several electron beams trespassing therethrough. After the primary beams are focused on the specimen, the beams of primary charged particles undergoes different interactions with the specimen resulting in secondary particles wherein, the term "secondary particles" is to be understood as including all particles leaving the specimen. Those secondary particle beams (see, e.g., 12'; 13' and 14' in FIG. 1) that go through the deflector 130, and which are for example accelerated towards the deflector 130, are deflected towards the beam bender 160.

Generally, beam benders such as bending sectors that might be combined with the embodiments disclosed herein might be electrostatic, magnetic or combined electrostatic-magnetic. Since the space required for an electrostatic bending sector is smaller than the space needed for a sector including a magnetic part, typically an electrostatic sector is used. An electrostatic bending sector may be two electrodes which are shaped roundly. The sector may have a negatively-charged electrode and a positively-charged electrode serving to bend the electron beam. Thereby, the electron beam is focused in one dimension and, additionally, is kept at a high energy to avoid time of flight effects which may have impact on a high-speed detection. A focusing in the second dimension can take place in a quadrupole element, by an electrostatic side plate or a cylinder lens. Thereby, a double-focusing bender, e.g. in the form of a double-focusing sector unit can be provided.

Thereby, the beam of secondary charged particles can be deflected by about 90° with respect to the beam of primary charged particles. However, other values between 30° and 110°, typically between 45° and 95° or between 60° and 85°, are also possible. Additional to the deflection, the beam is typically also focused, as described above already. One advantage of applying a bending sector is that the beam of secondary charged particles is guided away from the direct vicinity of the primary charged particle beam. Thus, analysis tools can be applied in the charged particle beam device without the need to fit them into the limited space nearby the primary charged particle beam and furthermore, without leading to undesirable interactions with the primary charged particle beam.

Instead of the electrodes, which may optionally be provided with additional side plates, the bending sector can be a hemispherical sector. The hemispherical sector allows for the two-dimensional focusing of the beam. Thus, no additional focusing unit is required for a double focusing sector unit. Generally, an electrostatic beam bending sector can be either cylindrical or hemispherical. The cylindrical type suffers from the fact that as the beam is bent the secondary electrons are focused in one plane and not in the other. A hemispherical bending sector focuses the secondary beam in both planes. The cylindrical sector can be used with side plates biased to achieve focusing in the transverse plane, yielding similar focusing properties to the hemispherical sector.

A model of an achromatic beam separation or beam deflector, which may also be used as an embodiment, which can be combined with other embodiments described herein, can be described as follows. Saddle coils having an inner diameter of 36 mm and a 2 mm×2 millimeter X-section, as well as 40 ampere turns, may further have a length of about 30 mm. A 60° angle of the saddle coils can reduce or avoid hexapole components. Further, alternatively, a combination of coils with a 42° and 78° angle can reduce or avoid hexapole and decapole components. The electrostatic deflector, i.e. the electrodes shown in FIG. 2B, may have an optical geometry of an inner diameter of 16 mm and a length of 30 mm. Further, a +−500 V deflection voltage (static) floating on column voltage can be provided. If, as described with respect to FIG. 2B, x,y,=0.7071·X,Y, hexapole and decapole components may be reduced or avoided. For the model, the column voltage is given as 9.5 keV, that is the, voltage can in general be set on increased potential (e.g., 5 times, 10 times or even 20 times increase) for providing the beam boost within the column, and the landing energy is 500 eV or 1 keV, respectively.

Figure 3A:
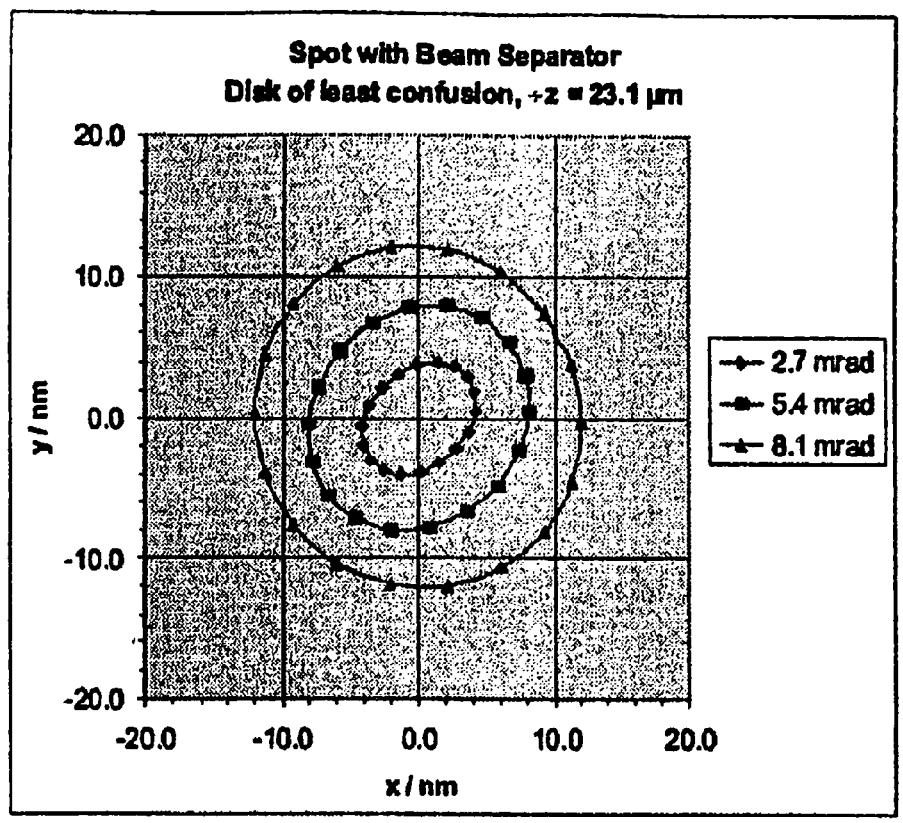
FIGS. 3A to 3E show results of model simulations for an achromatic beam separator according to embodiments described herein.
Figure 3B:
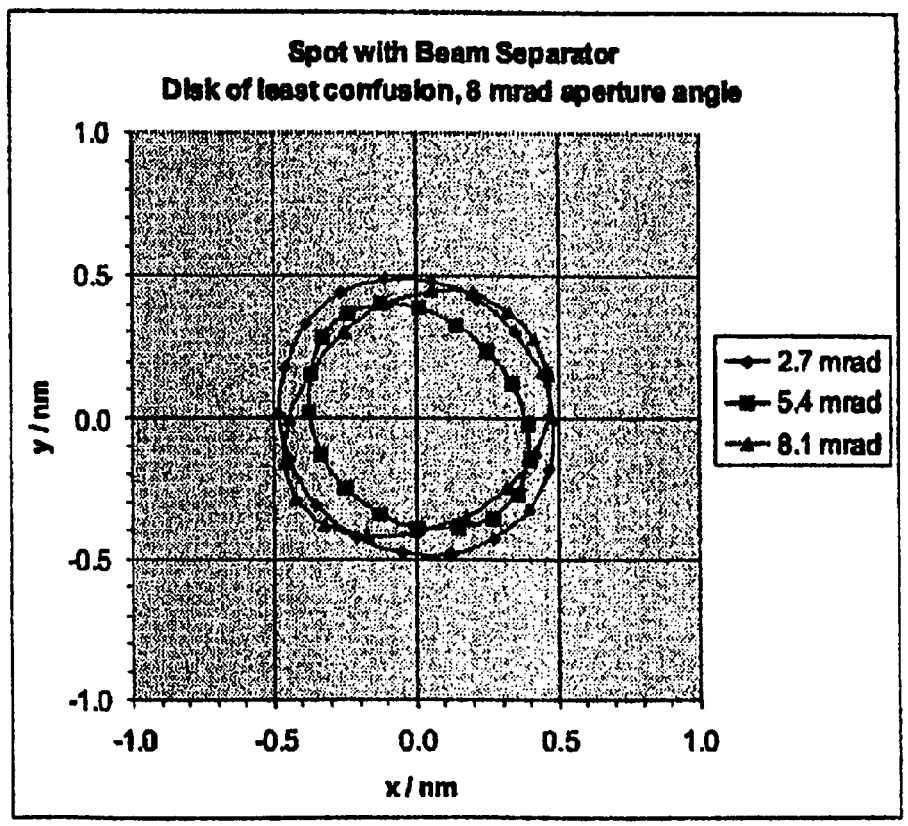

FIG. 3A presents a simulation result of the beam separator. The deflection causes some astigmatism. However, the astigmatism is small enough to be corrected. The corrected astigmatism is shown in FIG. 3B. Thereby, the spot diameter can be reduced from 24 nm in FIG. 3A to about 1 nm in FIG. 3B.

Figure 3C:
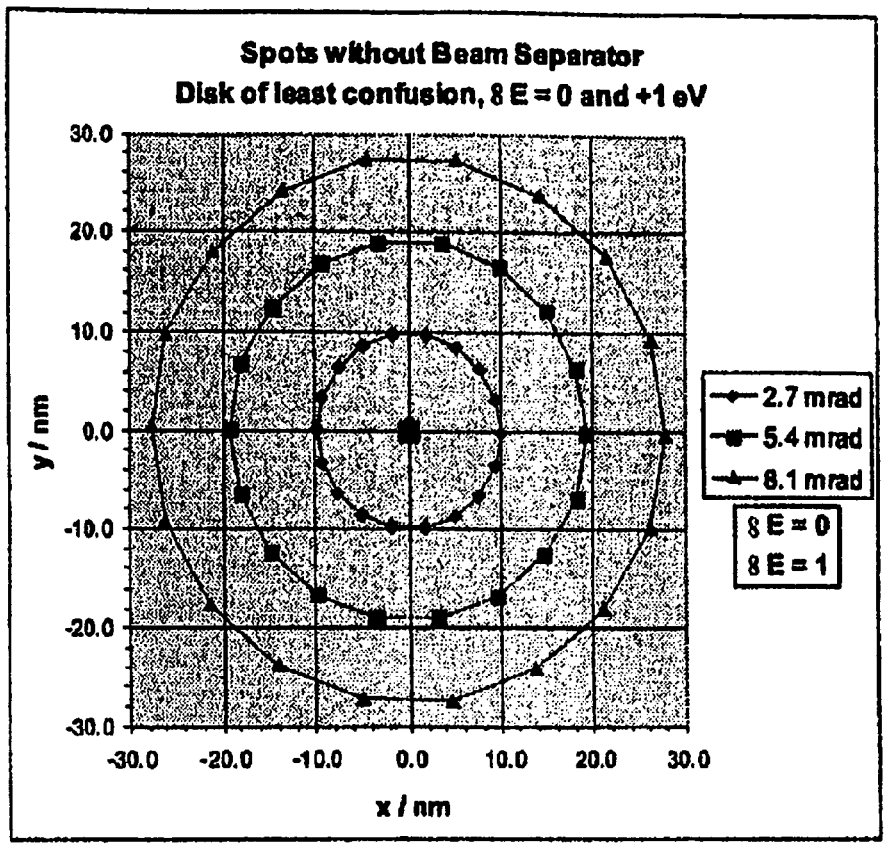
Figure 3D:
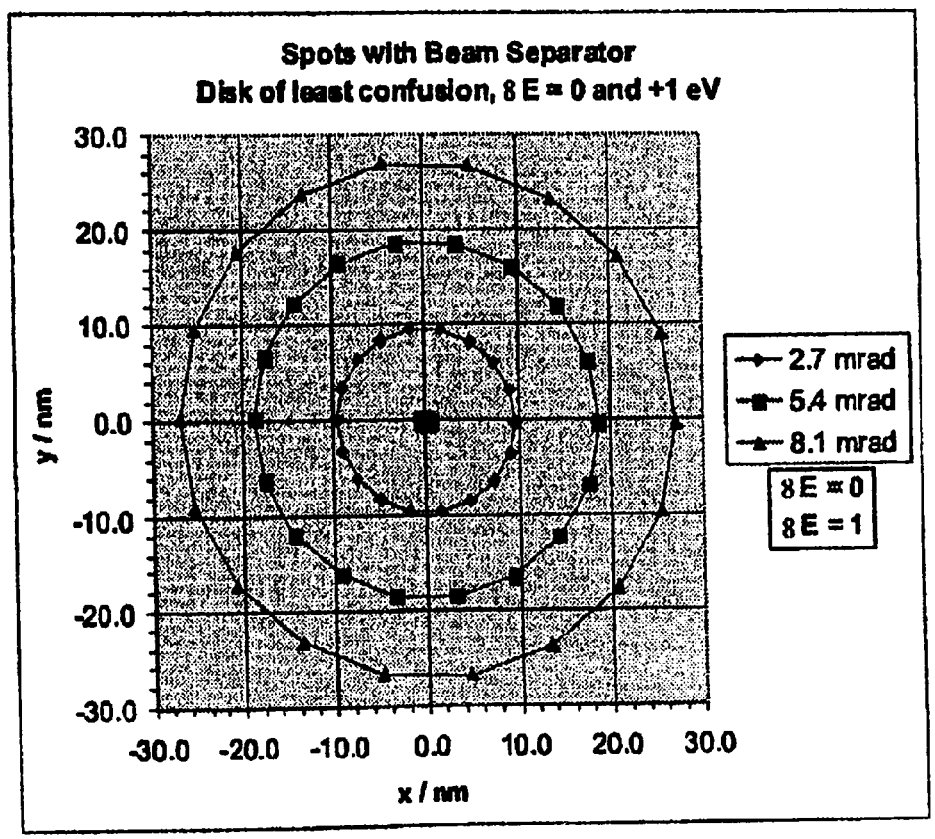
Figure 3E:
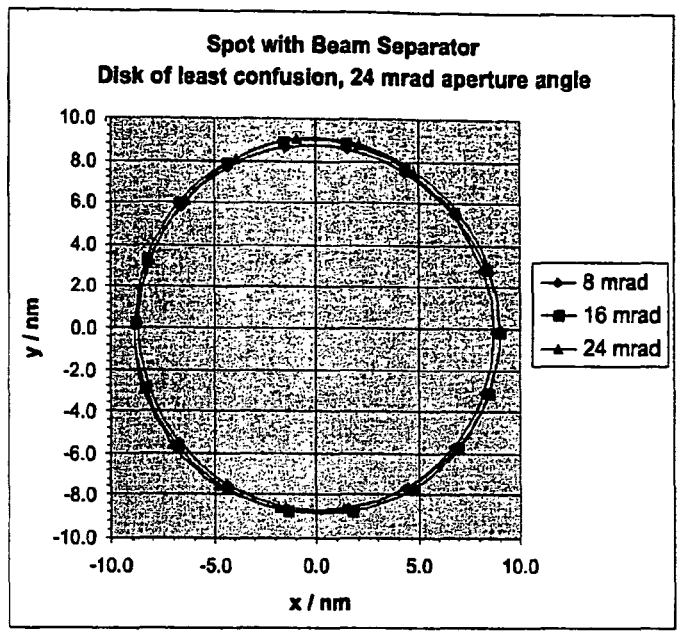

FIGS. 3C and 3D further show that the achromatic beam separator or achromatic beam deflector, which has been described above, does not introduce additional chromatic aberrations. Thereby, FIG. 3C shows the spots without the beam separator, wherein FIG. 3D shows the spots with a beam separator. In the FIGS. 3C and 3D no substantial difference can be seen. FIG. 3E shows a further simulation of the beam separator showing large beam X-sections with a 60° saddle coil. As can be seen in FIG. 3E, no significant additional aberrations, for example "hexapole" coma, are introduced. Accordingly, a 60° saddle coil with large diameter can be considered sufficient for embodiments of an achromatic or low aberration beam separator as described herein.

As can be shown by simulations, the achromatic beam deflector is also not very sensitive to energy changes of the landing energy on the specimen. Thus, the tolerance with respect to the change of energy can be reduced for smaller deflections. The deflector does not need to be readjusted for small energy variations.

Figure 4:
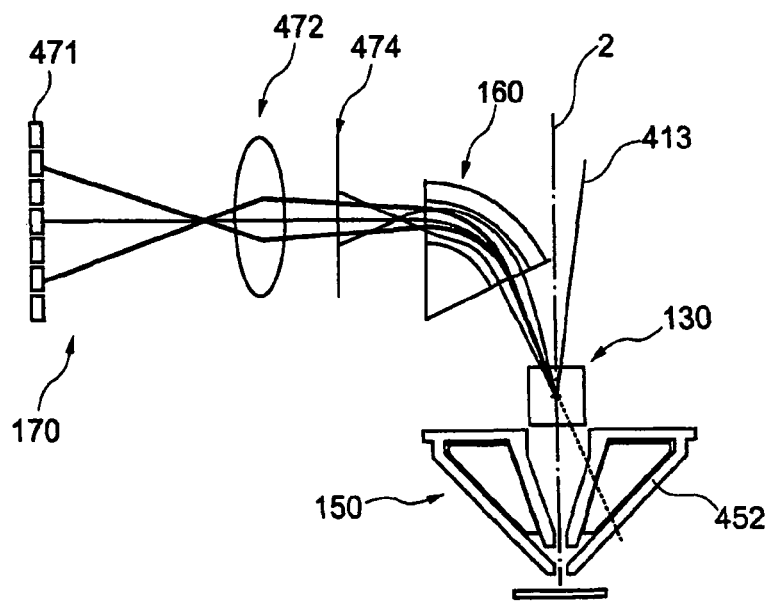
FIG. 4 shows a schematic view of a detection scheme for multi-beam scanning electron beam devices according to embodiments described herein.

Further alternative or additional implementations with regard to the detection that might for example include a spectrometer, will now be described. Thereby, reference will partly be made to FIG. 4. Generally, the achromatic beam separator might be considered achromatic for the primary electron beams but may introduce dispersion for the secondary signal beams. For easier understanding, FIG. 4 shows only one primary and one signal beam. However, the same principle can be used for a plurality of signal beams.

The achromatic beam deflector separates the signal beam from the primary beam and introduces a dispersion as indicated by the three different beams. After trespassing the beam bender, e.g., in form of a sector, the dispersion can be seen in the plane of a dispersive image indicated by reference numeral 474. The lens 472 images the different virtual images corresponding to different signal beam energies on the sub-detection elements 471. Thereby, energy filtering can be realized.

The beam rays of the center beam is indicated in FIG. 4. As can be seen there is a crossover shortly after the bending sector 160. Generally, according to other embodiments, the sub-detection elements may also be positioned directly after the bender 160, typically in the focus of the different signal beams having different signal energies. However, the lens 472 allows for imaging and magnification of the energy spread. Accordingly, a fast and parallel detection of different ΔE channels can be realized. This might for example be used for element mapping or potential mapping, e.g., for dopant profiles.

If a multi-beam system is used, a further sub-detection element array can be provided adjacent to the sub-detection elements 471 shown in FIG. 4.

According to other embodiments, the use of a multi-beam scanning electron system and method of operating multi-beam scanning electron systems according to embodiments described herein are provided. Generally a 2-D array of scanning electron beams is provided, thereby, typically each electron beam has the resolution performance similar to a single beam device, for example a CD-SEM. In the array, each beam scans a few square microns and the overall throughput is the multiplication of a single beam throughput with the number of beams.

Generally, a wafer to be inspected is positioned in the tool on an XY-stage. According to some embodiments, which can be combined with other embodiments described herein, scanning is done in the step and scan manner. Thereby, during scanning the stage is not moved and waits until the current frame scanning is completed. When the scanning of the frame is finished the stage travels to the next frame location.

One major problem for multi-beam scanning electron beam devices is the beam overlap within such high throughput systems because a significant part of the surface may lie within two beams. Thereby an overlap of the scanning area of two adjacent beams is provided. This overlap is generally problematic for electron beam imaging as the overlap region will suffer from a different charging regime, in particular if scanning of overlapping regions is conducted within a short time period.

According to different embodiments, which might be combined with each other, an improved scanning is provided. According to one alternative, a combined scan can be provided. Generally for a design for manufacturing (DFM) die to database scanning, systematic defects should be detected. Accordingly, according to some embodiments described herein, it is possible to deduce the inspection result from a virtual die image. Thereby, a virtual die image can include portions of several physical dies. The virtual die image can be built in a way that will not require overlaps between beams on the array, in particular not within a time period that is sufficient in order to have previously charge been degraded. The first option is a rectangular scanning scheme wherein portions of four different dies are scanned in order to generate one virtual die image. As shown in FIG. 5A, each of the portions 1, 2, 3 and 4 are portions of two or more (up to four) physical dies. These images are combined to form a virtual die 504 image which is used for inspection purposes.

FIG. 5B shows a hexagonal scanning scheme, which includes scanning of three different portions 502 of different dies in order to form a virtual die image, which can be used for inspection purposes. The overlap 503 shown in FIG. 5B has no negative effect since the scanning of a physically neighboring region can be conducted after a charge of the respective specimen region has sufficiently disappeared.

According to another embodiment, a trapezoid current profile, as shown in FIG. 6, can be used for the beam current of the individual electron beams. Thereby also a single die can be scanned. It is assumed that the beam overlay effect can be reduced significantly by a scanning scheme that will ensure an overall current density in the overlap region 604 that is equal to the current density in the non-overlap regions 602. If, as an example, the beams are placed in a regular rectangular grid and the scattering amplitude is larger than the periodicity of the grid, an overlap is created.

According to some embodiments, which can be combined with other embodiments described herein, the overlap regions 604 are scanned as follows: In the scanning direction, which is denoted as the X-direction, the current profile is a trapezoid, wherein the cap (602) of the trapezoid corresponds to the single beam region 602 and the beam current of the respective electron beams decreases linearly along the overlapping region 604. Thereby, the total current in the overlap region 604 is equal to the current in the cap region of the trapezoid, where only a single beam is used.

Further, for the Y-axis the lines scanned in the X-direction will have a line current that will be modulated in a similar manner. The overlap image signal can be detected in parallel on those two beam detectors, which correspond to the two electron beams generating the overlap.

According to optional implementations, image processing techniques which can for example be based on interpolations, will be applied to recombine the two images. Thereby an image quality of the combined image can be similar or close to the image quality in the single beam regions.

Figure 7:
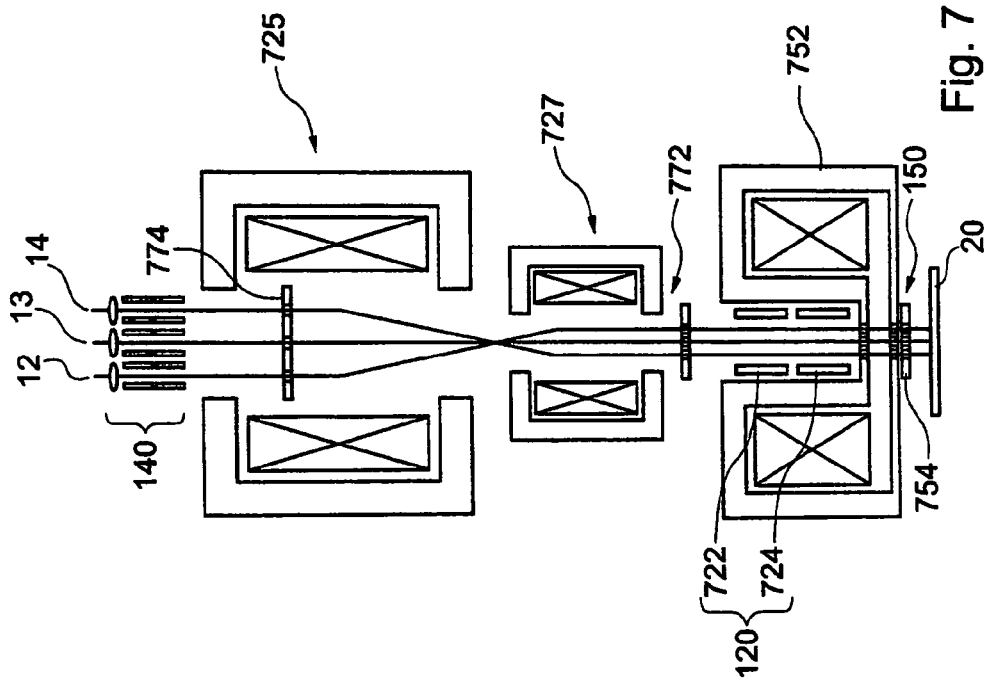
FIG. 7 shows a schematic view of a further multi-beam scanning electron beam device according to embodiments described herein.

As for example shown in FIG. 7, according to further embodiments, which might be combined with other embodiments described herein, a multi-beam scanning electron beam device can be provided as follows. In FIG. 7, the beam generation is not shown. The beams can for example be generated by an array of individual emitters or a single emitter. Alternatively, they can be generated by a grid aperture array, a grid lens array, a combination thereof and/or a grid aperture array and a lens. Thus, according to some embodiments described herein, as for example shown in FIG. 1, the multi-beam scanning electron beam device 100 may have a multi-beam emitter 110 including a single emitter tip 102, one or more elements for extracting, accelerating and/or shaping the electron beams and a grid aperture 106 for generating individual electron beams. According to other embodiments, an emitter array with individual emitters for each electron beam can be used. According to yet other embodiments, or a spot grid array, wherein the emission of one emitter tip is shaped and formed to exit in parallel and as corrected beams can also be used. Thereby, the grid aperture array or two or more grid aperture arrays can be used at one ore more potentials in order to shape and/or focus the beam. Accordingly, the emission of one emitter can appear in the column as multiple sources. Thus, subsequent optical elements or in combination with subsequent optical elements the multiple beams at the specimen appear to be generated by multiple sources. In light of the above, on the one hand, two or more emitters can be used for generation of the multiple beams. On the other hand, one emitter can be used. Thereby, one source or two or more sources can be provided by the one emitter.

The beams 12, 13 and 14, respectively pass first through individual electron beam optics 140 which can for example include lenses, multi-poles and the like. At this position in the electron beam column, the individual electron beams have a relatively large distance with respect to each other. The distance of the individual beams with respect to each other can according to some embodiments be reduced by an adapting optics having a first lens 725 and the second lens 727. As shown in FIG. 7, a demagnifying adapting optics can be provided. Thereby, the distance of the electron beams with respect to each other can be reduced. Thereafter, according to some embodiments, which can be combined with other embodiments described herein, the distance between adjacent beams can be in a range of 1.5-3.5 mm, typically 2-3 mm. The plurality of electron beams is further influenced by common electron beam optics 120 such as a beam corrector 722 and a common deflection system 724. A common objective lens array focuses the plurality of electron beams on the specimen 20. Thereby, a magnetic objective lens component 752 and an electrostatic lens component 754 having one or more electrode plates can be used. Accordingly, a common objective lens assembly 150 is provided.

Accordingly, for some embodiments described herein, a magnifying or demagnifying adapting optics for adapting the distance between the electron beams with respect to each other can be provided. However, thereby a cross-over for the individual electron beams might be generated which increases the electron-electron interaction.

Generally, it might be desirable to combine advantages of individual columns with large beam spacing and a beam array with small beam spacing in one system by providing an adapting optics. Thereby, according to some embodiments described herein, an array of electron or charged particle emitters with a spacing sufficient for integration of elements for individual beam control can be provided. These individual electron beam optics might be deflectors, lenses, stigmators, and the like. Thereby, according to different embodiments, which can be combined with other embodiments described herein, the electron emitter can be based on one or more conventional thermal emitters, field emitters, or combined thermal-field (Schottky) emitters. It may also be an array of photo emitters.

Further, the multi-beam array may be formed by a separation of one beam from one emitter tip into a plurality of beamlets, for example by use of a grid aperture or a spot grid array. Thereby, the space of the electron beams with respect to each other can allow for individual electron beam optics for controlling the electron beams individually. Further, according to some embodiments described herein, an optical demagnification system can be provided, as shown in FIG. 7. Thereby, the spacing of the beam array is demagnified to the final requirements for simultaneous inspection of one die or a small number of adjacent dies, for example two or three dies. As a typical example, an optical system with minimized (compensate) off-axis aberrations like a lens doublet can be provided for the adapting optics. Thereby, according to further embodiments, which can be combined with other embodiments described herein, the lens system can be magnetic, electrostatic or combined electrostatic-magnetic and can contain two or more lenses.

Further, as exemplarily shown in FIG. 7, common electron beam optics for global beam array manipulation are provided. According to different embodiments, the common electron beam optics may include a deflection system for alignment and/or scanning, lens systems for focusing adjustments of the beam array, lens systems for corrections, global stigmators, and the like.

Further, an array of common objective lenses, that is, a common objective lens assembly can be provided. Thereby, the objective lens assembly may have individual openings for each beam. However, a common objective lens assembly is provided by the common excitation, which focuses the individual electron beams simultaneously.

Further examples of common objective lenses can include magnetic lenses having a common excitation coil with common pole pieces and an array of individual bores (openings), or common electrostatic lenses having individual bores (openings) in a common lens plate being on one potential. Thereby, according to different embodiments, which can be combined with other embodiments described herein, an electrostatic lens or an electrostatic lens component of the common objective lens assembly can be used in an acceleration mode or as a retarding electrostatic lens.

According to further embodiments, which can be combined with other embodiments described herein, a multi-beam scanning electron beam device as, for example shown in FIG. 7, includes a detection system wherein an array of detectors is provided. Thereby, a detector corresponding to each electron beam is provided. If the electrostatic lens components 754 is provided as a retarding electrostatic lens, the secondary electron beams are accelerated and transferred through the objective lens and can for example be detected on the detector 772. The detector 772 may be an array of annular electron detectors above the objective lens. The secondary electron beam, i.e., the signal beam may also be transferred to the optical adapting system, which is in FIG. 7 a demagnification system for the primary beams and, thus, a magnifying system for the secondary beams. Thereby, the separation between the individual beams is increased and in the case of a magnetic system the secondary electron beams are separated from the primary beams by the Lamor rotation of the secondary electron beams. Accordingly, a further simplification of the design of the detector 774 can be realized.

According to further embodiments, the detection can also be improved by a further separation of the primary and the secondary beam arrays. In this case, a beam separator based on a magnetic field or a combined electrostatic-magnetic field can separate the secondary beam array from the path of the primary beam array. According to some embodiments described herein, an achromatic beam separator as discussed e.g. with respect to FIGS. 2A-2D and can be used. The "complete" separation simplifies design of the detector and allows easier integration of elements for an energetic and/or annular discrimination such as, for example energy filters and spectrometers, and/or elements for annular multi-perspective detection. According to further additional or alternative implementations, the detection system may contain sector field-based spectrometers, a retarding field spectrometer, lenses for annular control, deflectors for alignment and selection and the like. Thereby, according to typical embodiments described herein, a common separation, filtering, alignment, annular control is provided. Further, an array of detectors or individual detectors for individual detection of each beam is provided.

Figure 8:
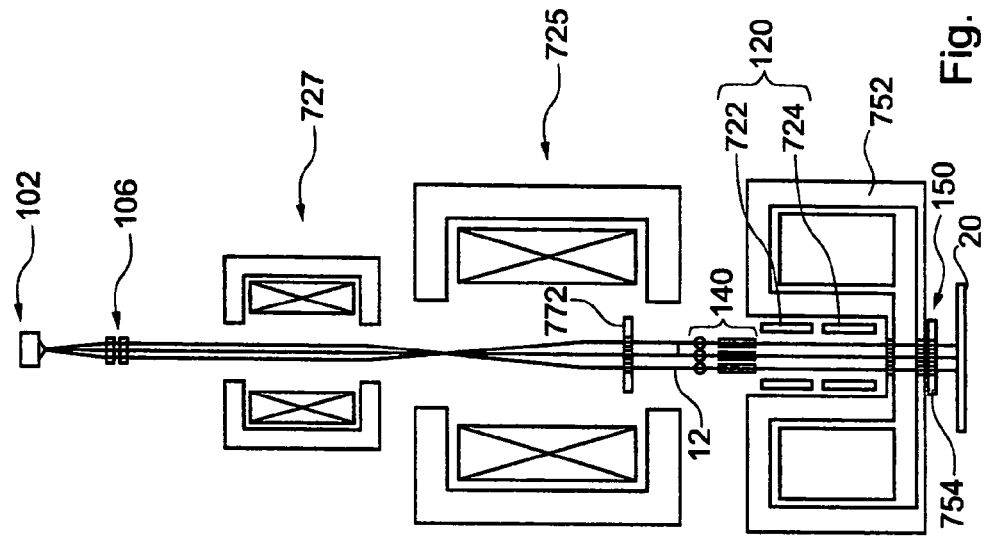
FIG. 8 shows a schematic view of a further multi-beam scanning electron beam device according to embodiments described herein.

Further embodiments, which can be combined with other embodiments described herein, are described with respect to FIG. 8. Thereby, a single emitter tip 102 is provided. If for example the emission angle of the single emitter tip 102 is comparably small, the separation provided by a grid aperture array or a spot grid array can be relatively small. Thus, instead of an electron emitter array with a spacing sufficient for individual beam control, an emitter array with a small beam separation is provided. Accordingly, for some embodiments, a magnification of the beam spacing can be desired. As shown in FIG. 8, a magnification system having lenses 727 and 725 is provided. As described with respect to FIG. 7, several embodiments can be used for the adapting optics. Typically, an optical system with minimized (compensated) off-axis aberrations like a lens doublet can be provided. After this increase of the beam separation, individual electron optical elements 140 can be provided such that each electron beams 12, 13 and 14 can be individually controlled.

A common objective lens array focuses the plurality of electron beams on the specimen 20. Thereby, a magnetic objective lens component 752 and an electrostatic lens component 754 having one or more electrode plates can be used. Accordingly, a common objective lens assembly is provided. Thereby, the objective lens assembly may have individual openings for each beam. However, a common objective lens assembly is provided by the common excitation, which focuses the individual electron beams simultaneously. Further examples of common objective lenses can include magnetic lenses having a common excitation coil with common pole pieces and an array of individual bores (openings), or common electrostatic lenses having individual bores (openings) in a common lens plate being on one potential. Thereby, according to different embodiments, which can be combined with other embodiments described herein, an electrostatic lens or an electrostatic lens component of the common objective lens assembly can be used in an acceleration mode or as a retarding electrostatic lens.

According to yet further embodiments, it might be possible to provide an electron beam array with a beam distance which allows individual optical elements 140 such as lenses, multipole elements for aberration compensation, deflection and/or stigmation control as well as common electron beam optics 120. The common electron beam optics 120 may include common scanning deflectors 724 and a common beam control element 722 such as alignment deflectors, stigmators or the like. As shown in FIG. 9, a common magnetic lens assembly 752 and common electrostatic lens assembly 754 can be used for focusing the primary electron beams on the specimen 20. A detection can be realized with a detection array 772 having a detection unit corresponding to the respective individual beams. Thereby, the elements shown in FIG. 9 can be modified according to the embodiments described herein, in particular with respect to FIG. 7.

FIG. 10 shows a combination of embodiments described with respect to FIG. 7 and embodiments described with respect to FIG. 1. A multi-beam emitter 110 is provided. As an example, as shown in FIG. 10, an array of individual emitters is provided. The electron beams have a spacing with respect to each other such that individual electron beam optics 140 can be provided. This can for example be individual lenses or individual multi-poles. A beam spacing adapting optics is provided by lenses 725 and 727. Thereafter, the electron beam array passes through a common achromatic beam deflector, which deflects the beam array of primary beams and further separates the primary beam array and the secondary beam array. Further, common electron beam optics 120 are provided and the electron beam array is focused on the specimen 20 by the common magnetic lens assembly 752 and common electrostatic lens assembly 754. The secondary beam array, that is the plurality of signal beams, is separated from a primary beam array by a common achromatic beam separator and the individual secondary beams are detected by an array of detection units or individual detectors, which are denoted by reference numeral 170.

FIG. 11A-11C show different embodiments for electron beam array generation according to embodiments that can be used for the high throughput tools described herein. FIG. 11A shows a multi-beam emitter 1110A having a single emitter 1102 and an aperture grid array, a lens and/or a lens array for generation of individual beamlets. Thereby, the emitter 1102 has a small emission angle that limits the separation of the beamlets. According to a further embodiment, which is illustrated in FIG. 11B, a single emitter 1102 may have a larger emission angle such that a lens can be used to guide the electron beam towards the aperture array. According to yet other embodiments, individual emitters 1104 can be provided such that an emitter 1110C can be provided. Thereby, also a spacing sufficient for individual electron beam optics 140 can be provided.

As described above, different options of generating the multi-beam array can result in different distances between the individual electron beams. Thus, the configuration of the optical elements in the multi-beam system may depend on the type of multi-beam emitter. In particular, the emitter spacing in the array can influence the configuration of the further optics. Accordingly, different embodiments may be provided. According to one embodiment, a multi-beam high throughput tool such as a multi-beam scanning electron beam device can include a multi-beam emitter formed by a single emitter tip and a separation device like an aperture array and/or a grid lens array, which form individual beamlets from the single beam. Further, individual electron beam optics such as lenses and multi-poles can be arranged in the array. The multi-beam high throughput tool further includes common electron beam optics such as deflectors for global alignment and scanning, common stigmators and other elements described herein. A common magnetic, electrostatic or combined electrostatic-magnetic grid lens array for focusing the individual beams on the specimen is provided. The multi-beam high throughput tool further includes a beam separation means like a common beam separator or a common lens for introducing a Lamor rotation. Further, a detection element including individual detection for the secondary beams is provided and may for example include and energetic and/or angular discrimination.

According to another embodiment, the above-described embodiment may have been a beam spacing adapting optics (magnification or demagnification) for the emitter array spacing in order to adjust the spacing of the emitted beams to the objective lens array spacing. Thereby, typically an optical system with minimized off-axis aberration can be used. According to alternative embodiments, the system may also include two adapting systems: one for magnification of a spacing in order to allow easier integration of the individual beam control components, and a further system for demagnification of the beam spacing in order to adapt the objective lens basing requirements.

According to alternative embodiments, which can be combined with the above described embodiments, different kinds of multi-beam emitters can be used according to the different embodiments described herein. According to yet other modifications, a plurality of individual emitters which can be further separated by grid one or more aperture arrays can be used for generation of the multi-beam array.

According to yet further alternative implementations, the common objective lens assembly may have a smaller number of openings than the number of individual beams in the array. Thereby, two or more beams may share one opening in the common objective lens array. However, it is preferred that at least two openings in the common objective lens assembly are provided.

According to further alternative or additional implementations, the double focusing bending element, such as a bending sector, typically a spherical electrostatic sector arrangement is provided. Typically, the individual beamlet detectors can be positioned close to the focus of the sector in order to avoid cross-talk between the individual beams. In order to improve the space requirements, a scintillation detector with a photomultiplier (PMT) and, for example, a light guide in between is provided for each beam. Thereby, sufficient space for a PMT-array can be realized. According to yet further embodiments, which can be combined with other embodiments described herein, mechanical and/or electromagnetic alignment for the individual secondary electron-beamlets on the individual detector channels can be provided. In light of the parallel detection of a plurality of beamlets, it is further possible to have individual detection electronics for each channel According to some embodiments which can be combined with other embodiments described herein, the systems for providing a high throughput tool may typically be a low-voltage system, i.e. having low beam energy on the specimen. This energy may for example be in the range of 100 eV to 5 keV. Typically it is possible for low-voltage beam energies to have the electrons traveling within the column on a high beam energy, for example 8-10 keV or 7 to 15 keV. This beam boosts principle can reduce the electron-electron interaction within one beamlet within the column in light of the shorter flight. According to even further alternative or additional implementations, the column components can be at ground potential whereas the emitter and the wafer are at a high potential. Thereby, the scan module, the beam separator and the bender can be at ground potential. This simplifies in particular the common electron beam optical elements.

Figure 12:
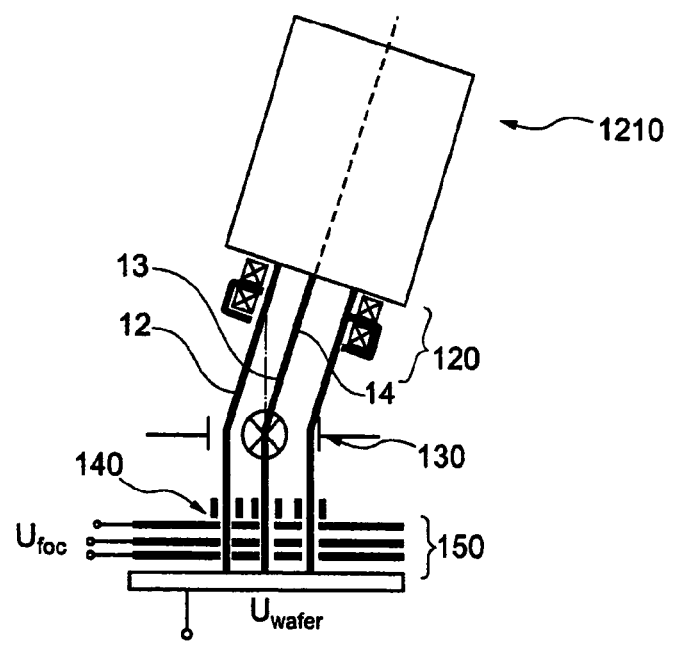
FIG. 12 shows a schematic view of a primary beam path of a further multi-beam scanning electron beam device according to embodiments described herein.

A further embodiment of a multi-beam scanning electron beam system is described with respect to FIG. 12. Thereby a spot grid array 1210 is provided for the generation of the multi-beam. In the gun condenser area the multiple beamlets are generated by a spot grid array. This can be considered beneficial in light of the fact that individual beams are emitted parallel to each other. Accordingly, a beam tilt as described with respect to FIG. 2C and/or a compensation of the achromatic separator as described with respect to FIG. 2D can be omitted for a vertical objective lens landing. Thereby, corresponding chromatic aberrations might be further reduced.

In FIG. 12 common electron beam optical elements 120 such as one or more common stigmators, one or more common beam alignment elements, or one or more common beam rotating elements for rotating the multi-beam array can be provided. Thereby, these components can typically have one opening for trespassing of two or more electron beams. Further, these common elements have a common control for influencing the individual beams simultaneously.

FIG. 12 further shows a common achromatic beam separator 130, individual electron beam optical elements 140 and a common objective lens assembly 150. Within FIG. 12, the beam path and the corresponding elements of the secondary electron beam array are not shown. However, it is understood that these components can be provided according to any of the embodiments described herein, for example with respect to FIG. 1 and/or FIG. 4.

According to embodiments described herein, the multi-beam electron beam inspection device can be used for the design for manufacturing (DFM) applications. According to a further embodiment, the system includes an achromatic primary beam separator for dividing beamlets of the primary beam array from beamlets of the signal beams, i.e. the secondary beam array. As described above, the secondary beam array might include secondary particles, backscattered particles and other charged particles which are released on impingement of the primary beams on the specimen. Typically, for some embodiments, a beam boost can be used for the beamlet configuration. That is, a high beam energy inside the column is provided and the electrons are decelerated to the final beam energy in the objective lens array. As described above, electron-electron interaction can be reduced by providing a beam boost, i.e. increased beam energy within the column.

Typically, if possible, the individual beams should travel on different beam paths and the cross-over should be avoided in order to minimise electron-electron interaction between the beams. This is particularly relevant for high total beam currents, which are typically used in light of the parallel imaging. The system also includes an array of objective lenses. According to typical implementations, this might be an electrostatic array, for example in acceleration mode. This configuration allows for small mechanical dimensions. Accordingly, a parallel imaging with a plurality of beams is simplified. However, magnetic lenses or combined electrostatic-magnetic lenses for simultaneously focusing the multi-beam array can also be used.

According to embodiments described herein, there are common electron beam optical elements for influencing two or more, typically all beamlets. These common elements can, for example, be a condenser lens such as a condenser lens for setting system magnification, total current and/or the divergence angle of the beamlets entering the objective lens array; common alignment and stigmation components; and/or common scanning components (if required). Further, common electron beam optical elements can optionally be rotation means for rotating the beamlet array, for example in an axial magnetic field.

The system further includes individual electron optical elements for influencing each element of the beamlet array individually. For example, the individual electron optical elements might be elements for focusing, stigmation correction, objective lens alignment, and/or beam scanning. The individual electron optical elements generate typically transversal electrostatic, magnetic or combined electrostatic-magnetic fields. These fields might be generated, for example by magnetic, electrostatic or combined electrostatic-magnetic multipole elements such as dipoles, quadrupoles, octupoles or higher order elements according to the requirements. Typically, for some embodiments the individual influencing elements can be located near the objective lens. Thereby, as further alternative or additional implementations, single stage or multistage arrangements are possible. For example a scanning element for individual beam scanning can be provided in the form of a single state scanning element or a two-stage scanning element.

As an example, an individual single stage scan deflector can be located in front of, or be integrated into the bore of each opening in the objective lens. Individual double stage scan deflectors can be located in front of the objective lens array in order to provide the pivot point inside the lens for improvement of operations and telecentricity. Thereby a vertical landing angle or a landing angle close to vertical can be provided.

According to some embodiments, which can be combined with other embodiments described herein, a high brightness emitter with large angular emission can be used to realize high currents in the beamlets as well as in the overall system. For example, thermal field emission cathodes such as TFE with large emitter curvature radii (e.g. 0.5 µm or larger or even 1 µm or larger) can be used. According to other embodiments, CFE, Schottky emitters, and the like can be used.

According to yet further implementations, additionally or alternatively a control electrode between the sample and the objective lens for controlling the extraction field for the secondary, i.e. released electrons can be provided. Thereby, as an example, the control electrode has openings for the primary and secondary beamlets. As a typical example, this electrode can be integrated in the objective lens array. As a further typical example, for electrostatic lenses, the control voltages might be added on the voltage of the lens electrode being closest to the specimen.

Multi-electron scanning electron beam systems described herein can further include a signal path with individual detection for each single signal beam, which is created by the primary beam array. Thereby, it is further possible that the signal beamlets penetrate the achromatic beam separator on individual traces. Individual detectors or an array with individual detection areas for each beam are located behind the beam separator. This can for example be a scintillator-photomultiplier arrangement with subsequence signal processing. Typically the signal processing can also be provided individually for each beamlet.

According to yet further implementations, which can be combined with embodiments described herein, an additional beam deflection element can be located behind the beam separator in order to increase the angles of separation between the primary beam array and the secondary beam array. Thereby, a mechanical arrangement of the detectors can be further simplified. Further, it is easier to provide a focusing means for each of the signal beamlets onto its corresponding detector if an additional beam separation is provided. As an example, which can be implemented for the embodiments described herein, the focusing means can be arranged in front of, after or in the additional deflection means. Typically, as described above, a double focusing additional element like a spherical sector element can be provided. This element can be electrostatic, magnetic or combined electrostatic-magnetic.

According to yet further embodiments, which can be combined with other embodiments described herein, the system specifications can include a current of the beamlets in a range of 10 pA to 10 nA, for example 100 pA to 1 nA. Further, spot diameters used for systems described herein may be in the range of 1 nm to 50 nm, typically 1 nm to 20 nm.

Further options for systems described herein may include an achromatic beam separator with a superimposed electromagnetic quadrupole, which might for example be generated by the octupole element shown in FIG. 2B. This quadrupole may influence the off-axis primary beamlets (in one direction) in such a way that all beamlets will exit the objective lens array with vertical incidents. Thereby, as described with respect to FIG. 2D, no individual beam tilt might be required if non-parallel beamlets are used in an achromatic beam separator. Thereby, chromatic aberrations for the beams can be reduced and, accordingly, the spot size and, thus, the resolution of off-axis beamlets can be improved.

As a further option for systems described herein, a spot grid array for generation of individual sources, i.e. individual shaped beamlets which appear as individual sources on the sample, may be used in the system. In light of the fact that individual sources can be provided in a spot grid array an individual beam tilt for having off-axis beamlets passing vertically through the objective lens can also be omitted. As a further alternative, individual emitter arrays may be applied as individual sources. For example, micro field emitter arrays, TFE arrays or photo-cathodes can be used. Thereby, as described above, generally for multi-emitters as described herein, one emitter might generate two ore more optical sources for the optical system.

Embodiments described herein also include methods for generating a multi-beam array from a common emitter by placing an aperture array in a divergent part of the emission. Further, methods of influencing the beamlets such that each beam has a specific performance with regard to its divergence angle, current, tilt angle with respect to the optical axis of the entire system, virtual tour size, and beam position with respect to the objective lens array are provided. These methods are controlled by the emission parameters, condenser lens excitation, and beam influencing means, i.e. common electron optical elements, individual being influencing means, i.e. individual beam optical elements, and/or the operation condition of the achromatic beam separator, typically a common achromatic beam separator.

Further embodiments relate to aligning each individual beamlet to its corresponding objective lens position (opening) by using the individual electron optical elements, which are provided in front of or within the objective lens. Further, methods can be directed to stigmation controlled by one or more stigmation elements. Methods may also be directed to the determination of the best focus, for example by a spot size or resolution measurements using the signal of each signal channel. Further embodiments are directed to methods for detecting the signal produced by each beam. Thereby, the signal electrons entering the objective lens are collected, the electrons are accelerated to high energies, for example 5-20 keV, the signal electrode beamlets are separated from the primary electron beam in the achromatic beam separator, and the signal electron beamlets are guided to individual detectors with subsequent signal channels. Typical embodiments of such implementations include focusing the individual beamlets on the individual detectors. Thereby, signal losses and cross-over between the beams can be reduced or avoided.

According to yet a further embodiment, methods to superimpose an electrostatic-magnetic quadrupole to an achromatic beam separator (electrostatic-magnetic dipole) is provided. The quadrupole can be aligned to the overall system optical axis, whereby off-axis beamlets will be tilted (in one direction) for vertical entrance into an objective lens array.

As describe above, embodiments can be directed to a multi-beam scanning electron beam device having a column. The device includes a multi-beam emitter for emitting a plurality of electron beams, at least one common electron beam optical element having a common opening for at least two of the plurality of electron beams and being adapted for commonly influencing at least two of the plurality of electron beams, at least one individual electron beam optical element for individually influencing the plurality of electron beams, a common objective lens assembly for focusing the plurality of electrons beams having a common excitation for focusing at least two of the plurality of electron beams, and adapted for focusing the plurality of electron beams onto a specimen for generation of a plurality of signal beams, wherein the common objective lens has at least two openings for trespassing of the plurality of electron beams, and a detection assembly for individually detecting each signal beam on a corresponding detection element. As further alternative or additional implementations, the at least one common electron beam optical element can be a common beam separator with a common control for separating at least two of the plurality of signal beams from the plurality of electron beams, the common electron beam optical element can have one opening for trespassing of at least two of the plurality of electron beams or for trespassing of the plurality of electron beams, the common beam separator can have one opening for trespassing of the plurality of at least two of electron beams or for trespassing of the plurality of electron beams, the common beam separator can be an achromatic beam separator, and/or the achromatic beam separator can be adapted for separating the plurality of electron beams and the plurality of signal beams without generation of a cross-over of the plurality of electron beams and/or the plurality of signal beams for separation.

According to yet other additional or alternative implementations, the device can include a quadrupole generation element superimposing the achromatic beam separator and adapted for generation of a quadrupole field for correcting the deflection angle of off-axis electron beams, a double focusing beam bender, in particular a hemispherical sector, wherein, for example, the double focusing beam bender can have one opening for trespassing of the plurality of beams, and/or a demagnifying or magnifying beam spacing adapting optics.

According to yet even further additional or alternative implementations, the common electron beam optical element can be selected from the group consisting of: an alignment element, an stigmation corrector, a scanning element, and rotating element for rotating the plurality of electron beams, and/or the individual electron beam optical element can be selected from the group consisting of a focusing element, a stigmation corrector, an alignment element, a beam tilt introducing element and a scanning element. Further, according to other embodiments, which can be combined with any of the embodiments described herein, the beam spacing on the specimen between adjacent beams can be in a range of 0.5 to 5 mm, in particular 1.5 mm to 3.5 mm, more particularly 2 mm to 3 mm, the individual electron beam optical element can be position adjacent to or within the common objective lens assembly, and or means for accelerating the plurality of electron beams to high energies between the multi-beam emitter and the objective lens, in particular to energies of 2 keV to 20 keV, and means for decelerating the plurality of electron beams before impingement on the specimen can be provided.

According to yet other alternative or additional implementations, the device may include focusing means for focusing each of the plurality of signal beams on the corresponding detection element, multi-beam emitter can be a spot grid array having individual emitters for each of the plurality of electron beams, the device can be adapted for avoiding a cross-over in the column, and/or the common objective lens assembly can be an electrostatic lens assembly, in particular in acceleration mode.

According to other embodiments, a method of operating a multi-beam scanning electron beam device for generation of an image of a wafer including two or more dies is provided. The method includes scanning a first region of a first die of the two or more dies for generating an image of the first region, scanning a second region of a second die of the two or more dies for generating an image of the second region, combining the image of the first region and the image of the second region to an image of a virtual die. Thereby, as one optional implementation the virtual die can be combined by images of regions of three or four dies of the two or more dies.

According to yet other embodiments, a method of operating a multi-beam scanning electron beam device having at least a first and a second electron beam for generation of an image of a wafer including at least one die, is provided. The method includes scanning a non-overlap first region of the die with a first electron beam current of the first electron beam for generating an image of the first region, scanning a non-overlap second region of the die with a second electron beam current of the second electron beam for generating an image of the first region, and scanning an overlap region between a scanning area of the first and the second electron beam with the first beam having an first overlap depending beam current function having electron beam currents being smaller than the first electron beam current and with the second beam having an second overlap depending beam current function having electron beam currents being smaller than the second electron beam current. According to additional implementations, the first current and the second current can be similar and the first overlap depending beam current function and the second overlap depending beam current function are similar and/or the first and the second overlap depending beam current functions can be a linear function.

According to yet other embodiments, a method of operating an achromatic beam deflector for charged particle beams can be provided. The achromatic beam deflector having an optical axis. The method includes providing a deflecting electrostatic dipole field, providing a deflecting magnetic dipole field, superimposing a quadrupole field to the magnetic dipole field and the electrostatic dipole field, wherein the electrostatic dipole field and the magnetic dipole field are adjusted with respect to each other to provide an achromatic beam deflection, and wherein the quadrupole field is adjusted to correct for a beam tilt of off-axis charged particle beams. According to typical implementations, the charged particle beam can be deflected for an angle of between 0.3° and 7°, the quadrupole field can be aligned to the optical axis of the achromatic beam deflector, an off-axis beam of a multi-beam array can be corrected and/or a correction can be done along one direction.

While the foregoing is directed to embodiments of the invention, other and further embodiments of the invention may be devised without departing from the basic scope thereof, and the scope thereof is determined by the claims that follow.

The invention claimed is:

1. A multi-beam scanning electron beam device having a column, comprising:
   a multi-beam emitter for emitting a plurality of electron beams, wherein the multi-beam emitter is a spot grid array configured to be used at one or more potentials so that the emission of one emitter appears to be generated by multiple sources;
   at least one common electron beam optical element having a common opening for at least two of the plurality of electron beams and being adapted for commonly influencing at least two of the plurality of electron beams;
   at least one individual electron beam optical element for individually influencing the plurality of electron beams;
   a common objective lens assembly for focusing the plurality of electron beams having a common excitation for focusing at least two of the plurality of electron beams, and being adapted for focusing the plurality of electron beams onto a specimen for generation of a plurality of signal beams, wherein the common objective lens assembly has at least two openings for passing of the plurality of electron beams, wherein the common objective lens assembly acts commonly on two or more of the plurality of electron beams and wherein the common objective lens assembly provides common objective lenses comprising magnetic lenses having a common excitation coil with common pole pieces and an array of individual openings, or comprising common electrostatic lenses having individual openings in a common lens plate adapted for being on one potential; and
   a detection assembly for individually detecting each signal beam on a corresponding detection element, wherein the at least one common electron beam optical element is a common beam separator with a common control for separating at least two of the plurality of signal beams from the plurality of electron beams, and wherein the common beam separator is an achromatic beam separator for the primary beam, wherein the device is adapted so that the beams entering the achromatic beam separator are parallel to each other, and wherein the device is adapted for avoiding a cross-over in the column.

2. The multi-beam scanning electron beam device according to claim 1, wherein the common electron beam optical element has one opening for passing of at least two of the plurality of electron beams or for passing of the plurality of electron beams.

3. The multi-beam scanning electron beam device according to claim 1, wherein the common beam separator has one opening for passing of the plurality of at least two of electron beams or for passing of the plurality of electron beams.

4. The multi-beam scanning electron beam device according to claim 1, wherein the achromatic beam separator is adapted for separating the plurality of electron beams and the plurality of signal beams without having a cross-over of the plurality of electron beams and/or the plurality of signal beams for separation, without having a cross-over inside the achromatic beam separator.

5. The multi-beam scanning electron beam device according to claim 1, further comprising:
   a double focusing beam bender.

6. The multi-beam scanning electron beam device according to claim 5, wherein the double focusing beam bender has one opening for passing of the plurality of signal beams.

7. The multi-beam scanning electron beam device according to claim 1, further comprising:
   a demagnifying or magnifying beam spacing adapting optics.

8. The multi-beam scanning electron beam device according to claim 1, wherein a further one of the at least one common electron beam optical element is selected from the group consisting of: an alignment element, a stigmation corrector, a scanning element, and a rotating element for rotating the plurality of electron beams.

9. The multi-beam scanning electron beam device according to claim 1, wherein the individual electron beam optical element is selected from the group consisting of: a focusing element, a stigmation corrector, an alignment element, a beam tilt introducing element, and a scanning element.

10. The multi-beam scanning electron beam device according to claim 1, wherein the beam spacing on the specimen between adjacent beams is in a range of 0.5 to 5 mm.

11. The multi-beam scanning electron beam device according to claim 1, wherein the individual electron beam optical element is positioned adjacent to or within the common objective lens assembly.

12. The multi-beam scanning electron beam device according to claim 1, further comprising:
an accelerating device for accelerating the plurality of electron beams to high energies between the multi-beam emitter and the objective lens of 2 keV to 20 keV; and
a decelerating device for decelerating the plurality of electron beams before impingement on the specimen are provided.

13. The multi-beam scanning electron beam device according to claim 1, further comprising:
a focusing device for focusing each of the plurality of signal beams on the corresponding detection element.

14. The multi-beam scanning electron beam device according to claim 1, wherein the multi-beam emitter is a spot grid array having individual emitters for each of the plurality of electron beams.

15. The multi-beam scanning electron beam device according to claim 1, wherein the device is adapted for avoiding a cross-over in the column.

16. The multi-beam scanning electron beam device according to claim 1, wherein the common objective lens assembly is an electrostatic lens assembly.

17. A method of operating a multi-beam scanning electron beam device for generation of an image of a wafer including two or more dies, comprising:
emitting a multi-beam from an multi-beam emitter comprising a spot grid array, providing the spot grid array with one or more potentials so that the emission of one emitter appears to be generated by multiple sources;
scanning a first region of a first die of the two or more dies for generating an image of the first region with a first primary electron beam of the multi-beam scanning electron device, wherein the first primary electron beam is configured to release a signal beam on impingement of the first primary electron beam on the wafer;
scanning a second region of a second die of the two or more dies for generating an image of the second region with a second primary electron beam of the multi-beam scanning electron device simultaneously with scanning of the first region with the first electron beam, wherein the second primary electron beam is configured to release a further signal beam on impingement of the second primary electron beam on the wafer;
providing an overall current density in an overlap region of the first primary beam and the second primary beam that is equal to the current density in non-overlap regions by using a scanning scheme scanning the first region of the first die and simultaneously the second region of the second die; and
combining the image of the first region and the image of the second region to an image of a virtual die, wherein the image of the one virtual die includes portions of the first die and the second die, wherein the image of the virtual die is built in a way that does not require overlaps between beams of the multi-beam scanning electron device on the wafer for providing the overall current density.

18. The method according to claim 17, wherein the virtual die is combined by images of regions of three or four dies of the two or more dies.

19. A method of operating a multi-beam scanning electron beam device having at least a first and a second primary electron beam configured to release signal beams on impingement of the first and the second primary electron beam on a wafer for generation of an image of the wafer including at least one die, comprising:
scanning a non-overlap first region of the die with a first electron beam current of the first primary electron beam for generating an image of the first region;
scanning a non-overlap second region of the die with a second electron beam current of the second primary electron beam for generating an image of the first region; and
scanning an overlap region between a scanning area of the first and the second primary electron beam with the first primary beam having a first overlap depending beam current function having electron beam currents being smaller than the first electron beam current and with the second primary beam having a second overlap depending beam current function having electron beam currents being smaller than the second electron beam current, thereby providing an overall current density in the overlap region that is substantially equal to the current density in the non-overlap first region and the non-overlap second region, wherein the scanning of physically neighboring regions on the wafer is conducted after a charge of the respective region of the die has sufficiently disappeared for providing an overall current density.

20. The method according to claim 19, wherein the first current and the second current are similar and the first overlap depending beam current function and the second overlap depending beam current function are similar.

21. The method according to claim 19, wherein the first and the second overlap depending beam current functions are a linear function.

22. The method according to claim 19, wherein the non-overlap first region is different from the non-overlap second region and that the scanning of the non-overlap second region is performed simultaneously with the scanning of the non-overlap first region.

23. The multi-beam scanning electron beam device according to claim 16, wherein the common objective lens assembly is in acceleration mode.

24. A multi-beam scanning electron beam device having a column, comprising:
a multi-beam emitter for emitting a plurality of electron beams, wherein the multi-beam emitter is a spot grid array configured to be used at one or more potentials so that the emission of one emitter appears to be generated by multiple sources;
at least one common electron beam optical element having a common opening for at least two of the plurality of electron beams and being adapted for commonly influencing at least two of the plurality of electron beams;
at least one individual electron beam optical element for individually influencing the plurality of electron beams, wherein the individual electron beam optical element is selected from the group consisting of: a focusing element, a stigmation corrector, an alignment element, a beam tilt introducing element and a scanning element;

a common objective lens assembly for focusing the plurality of electron beams having a common excitation for focusing at least two of the plurality of electron beams, and being adapted for focusing the plurality of electron beams onto a specimen for generation of a plurality of signal beams, wherein the common objective lens assembly has at least two openings for passing of the plurality of electron beams, wherein the common objective lens assembly acts commonly on two or more of the plurality of electron beams and wherein the common objective lens assembly provides common objective lenses comprising magnetic lenses having a common excitation coil with common pole pieces and an array of individual openings, or comprising common electrostatic lenses having individual openings in a common lens plate adapted for being on one potential; and a detection assembly for individually detecting each signal beam on a corresponding detection element, wherein the at least one common electron beam optical element is a common beam separator with a common control for separating at least two of the plurality of signal beams from the plurality of electron beams, and wherein the common beam separator is an achromatic beam separator.

* * * * *